United States Patent
Hiranobu (10) Patent No.: US 8,537,323 B2
(45) Date of Patent: Sep. 17, 2013

(54) DISPLAY WIRING SUBSTRATE AND DISPLAY APPARATUS

(75) Inventor: Jun Hiranobu, Tokorozawa (JP)

(73) Assignee: Casio Computer Co., Ltd., Tokyo (JP)

( * ) Notice: Subject to any disclaimer, the term of this patent is extended or adjusted under 35 U.S.C. 154(b) by 279 days.

(21) Appl. No.: 13/044,879

(22) Filed: Mar. 10, 2011

(65) Prior Publication Data

US 2011/0228197 A1    Sep. 22, 2011

(30) Foreign Application Priority Data

Mar. 16, 2010   (JP) .................................. 2010-058588

(51) Int. Cl.
*G02F 1/1345* (2006.01)

(52) U.S. Cl.
USPC .......................................................... 349/150

(58) Field of Classification Search
None
See application file for complete search history.

(56) References Cited

U.S. PATENT DOCUMENTS

| | | | |
|---|---|---|---|
| 6,806,920 B2 * | 10/2004 | Hayashi et al. | 349/58 |
| 2002/0018169 A1 * | 2/2002 | Kato | 349/149 |
| 2005/0018102 A1 * | 1/2005 | Hirano | 349/58 |

FOREIGN PATENT DOCUMENTS

| | | |
|---|---|---|
| JP | 2005-196224 A | 7/2005 |
| JP | 2008-299150 A | 12/2008 |
| JP | 2009-192976 A | 8/2009 |

* cited by examiner

*Primary Examiner* — Thanh-Nhan P Nguyen
(74) *Attorney, Agent, or Firm* — Holtz, Holtz, Goodman & Chick, PC

(57) ABSTRACT

A display apparatus includes a display panel, a drive circuit provided to the display panel, and a wiring substrate. The wiring substrate includes a proximal end portion joined to the display panel, an extended portion extended from the proximal end portion, a first fixed portion extended from the extended portion in one direction inclined from an extending direction of the extended portion, and a second fixed portion extended from the extended portion in the other direction inclined from the extending direction. The extended portion is folded back to face the proximal end portion. The first fixed portion and the second fixed portion are folded back so as to straddle side surfaces of the display panel and so that their end portions are arranged on a side of the display panel opposite to a side of the same on which the proximal end portion is arranged.

18 Claims, 9 Drawing Sheets

DISPLAY WIRING SUBSTRATE AND DISPLAY APPARATUS

CROSS-REFERENCE TO RELATED APPLICATIONS

This application is based upon and claims the benefit of priority under 35 USC 119 of Japanese Patent Application No. 2010-58588 filed on Mar. 16, 2010, the entire disclosure of which, including the description, claims, drawings, and abstract, is incorporated herein by reference in its entirety.

BACKGROUND OF THE INVENTION

1. Field of the Invention

The present invention relates to a display wiring substrate and a display apparatus.

2. Description of the Related Art

For example, as described in JP-A 2008-299150 (KOKAI), there has been conventionally known a liquid crystal module having a configuration that a main flexible wiring substrate is led out from a lower side of the liquid crystal module and bent 180° along a back surface, a strip-like light flexible wiring substrate is led out from one lateral side of the liquid crystal module and bent 180° at a pulled-out portion thereof along the back surface, and its end portion is joined to the main flexible wiring substrate. Since such a liquid crystal display apparatus has a configuration that the flexible wiring substrate is bent toward a rear side and its bent portion is fixed to a back surface side of the liquid crystal module, reaction force is produced in the flexible wiring substrate due to bending. Therefore, stress may be possibly concentrated on a joined portion between the flexible wiring substrate and the liquid crystal module to delaminate this joined portion.

BRIEF SUMMARY OF THE INVENTION

A display apparatus according to an aspect of the invention includes a display panel, a drive circuit provided to the display panel, and a wiring substrate having a wiring line through which a signal is output to the drive circuit. The wiring substrate includes a proximal end portion joined to a predetermined region of the display panel, an extended portion that is extended from the proximal end portion and on which the wiring line is routed, a first fixed portion extended from the extended portion in one direction inclined from an extending direction of the extended portion, and a second fixed portion extended from the extended portion in the other direction that is inclined from the extending direction of the extended portion and different from the one direction. The extended portion is folded back to face a surface of the proximal end portion on an opposite side of a surface of the same joined to the display panel. The first fixed portion and the second fixed portion are folded back so as to straddle side surfaces of the display panel and so that their end portions are arranged on a side of the display panel opposite to a side of the same on which the proximal end portion is arranged.

A wiring substrate according to an aspect of the invention includes a proximal end portion joined to a predetermined region of the display panel, an extended portion that is extended from the proximal end portion and on which the wiring line is routed, a first fixed portion extended from the extended portion in one direction inclined from an extending direction of the extended portion, and a second fixed portion extended from the extended portion in the other direction that is inclined from the extending direction of the extended portion and different from the one direction. Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A mode for carrying out the present invention will now be described hereinafter with reference to the drawings. However, various limitations that are technically preferable to carry out the present invention are provided to the following embodiment, but the scope of the invention is not restricted to the following embodiment and illustrated example.

The embodiment according to the present invention will be first described with reference to FIGS. 1, 2, 3, 4A, 4B, and 5.

Figure 1:
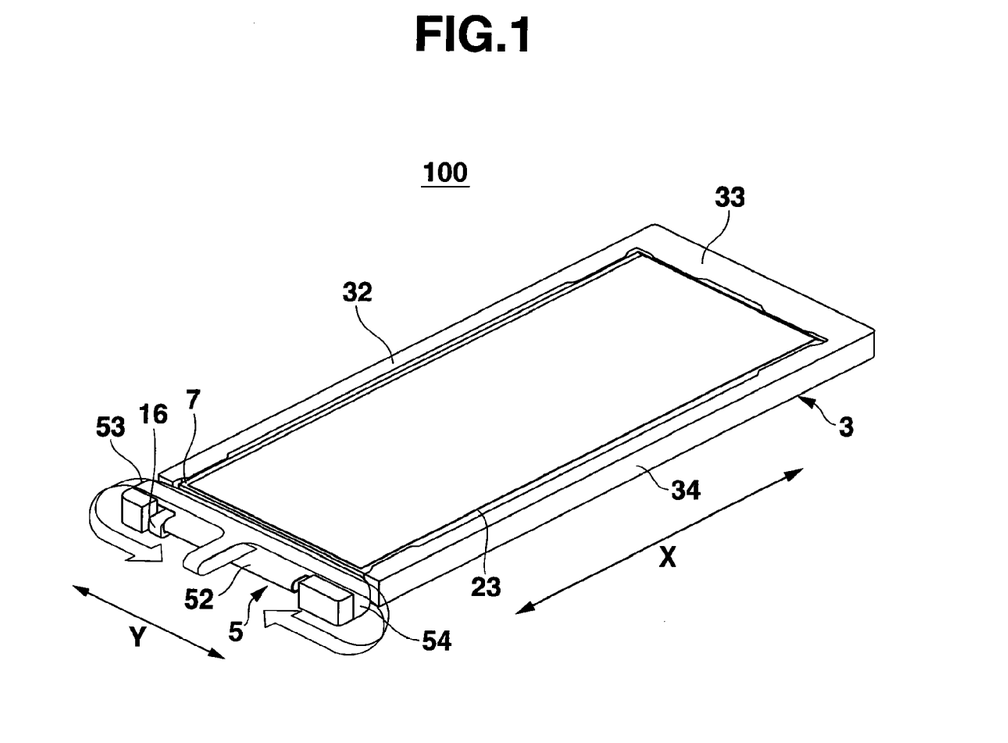
FIG. 1 is a front perspective view of a display apparatus according to an embodiment of the present invention.
Figure 2:
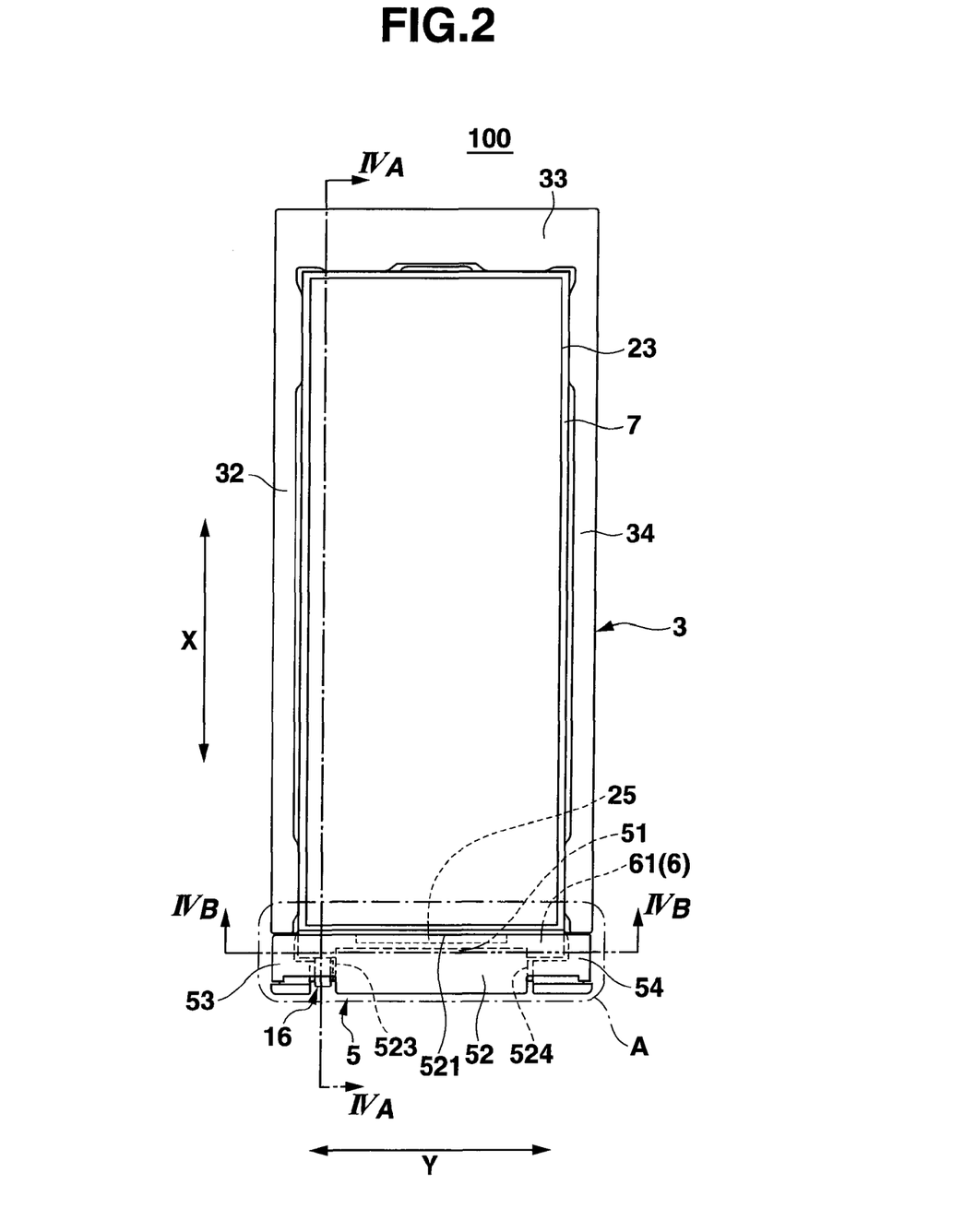
FIG. 2 is a front view of the display apparatus.
Figure 3:
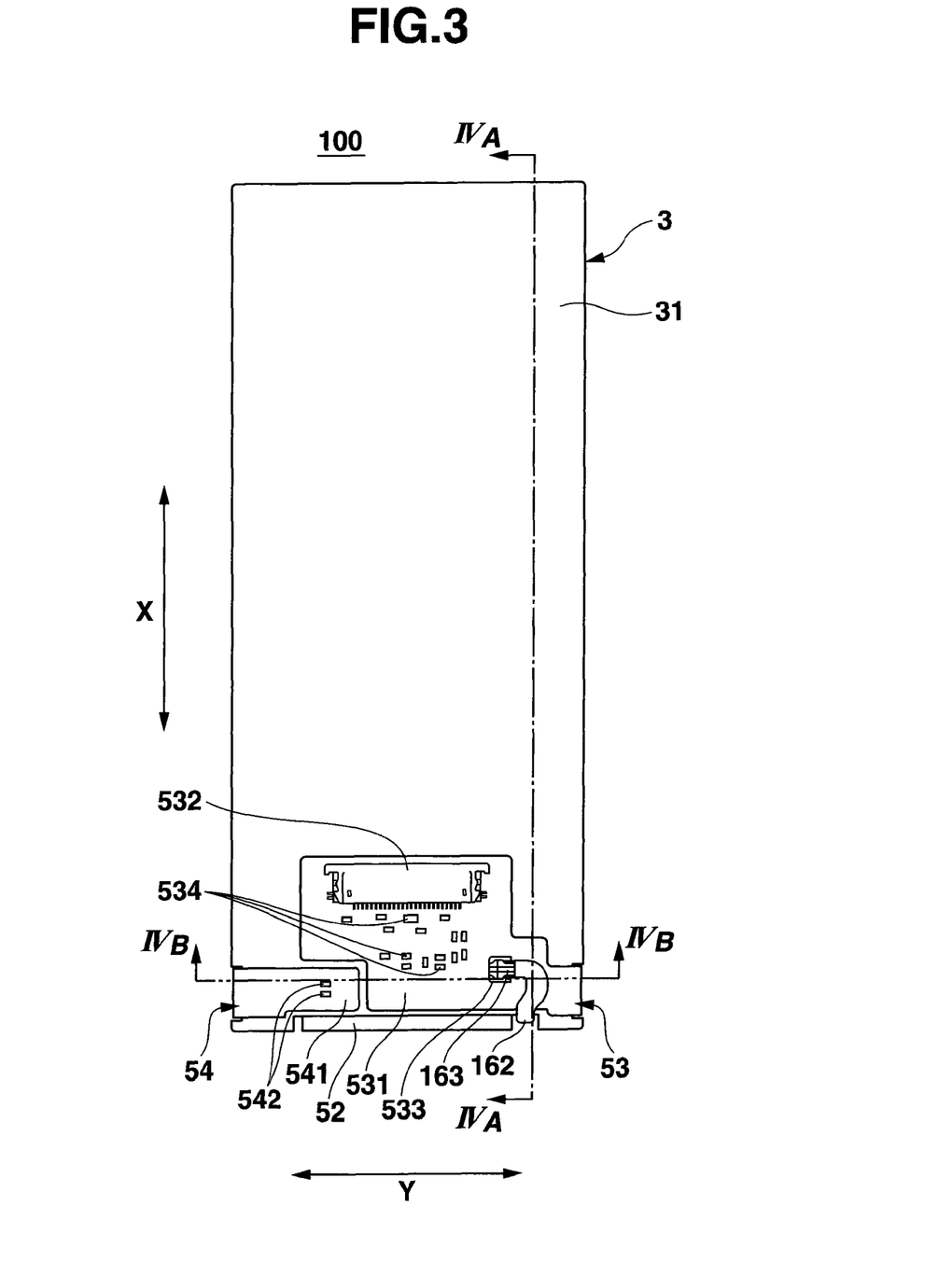
FIG. 3 is a rear view of the display apparatus.
Figure 4A:
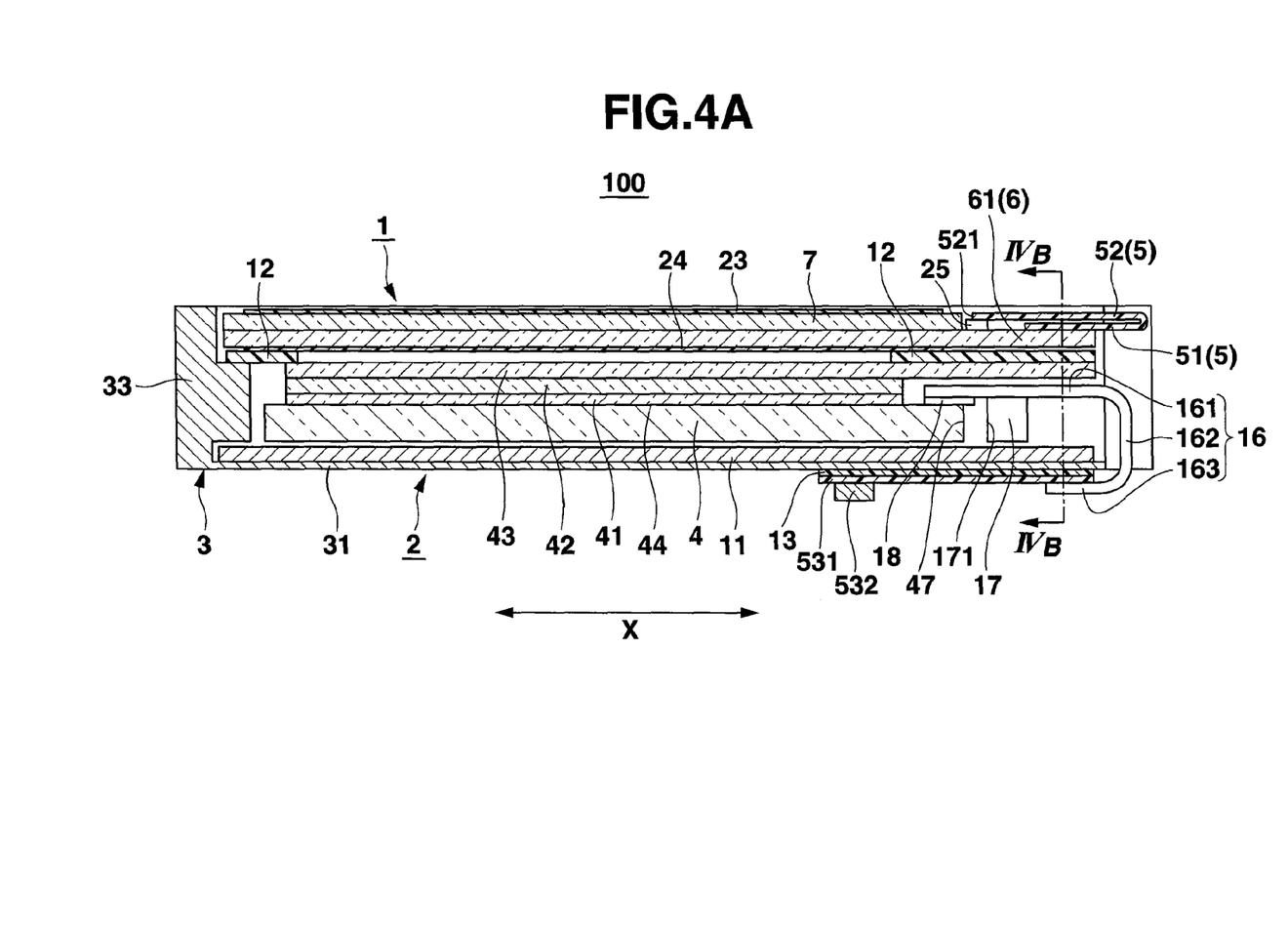
FIG. 4A is a cross-sectional view of a surface taken through a line IVA-IVA as indicated by arrowheads in FIG. 2 and FIG. 3.
Figure 4B:
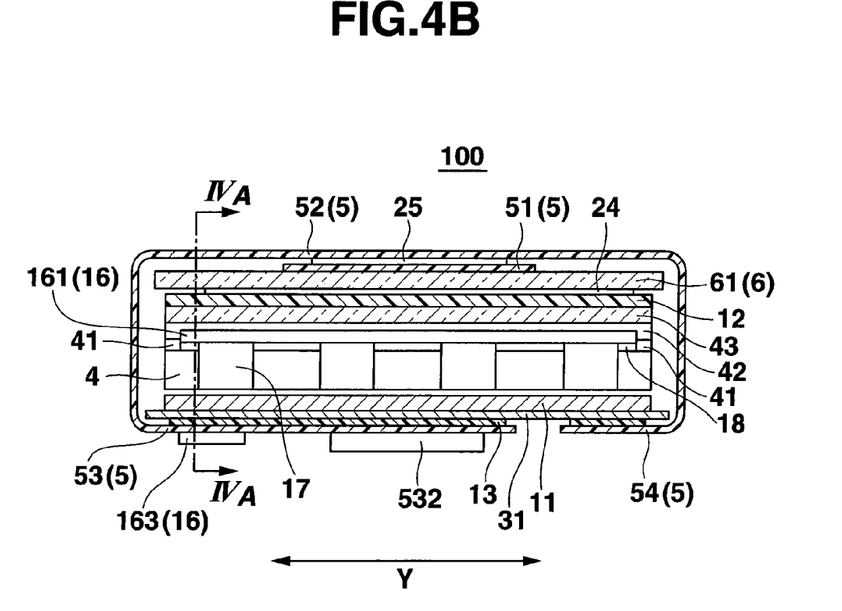
FIG. 4B is a cross-sectional view of a surface taken through a line IVB-IVB as indicated by arrowheads in FIG. 2 and FIG. 3.
Figure 5:
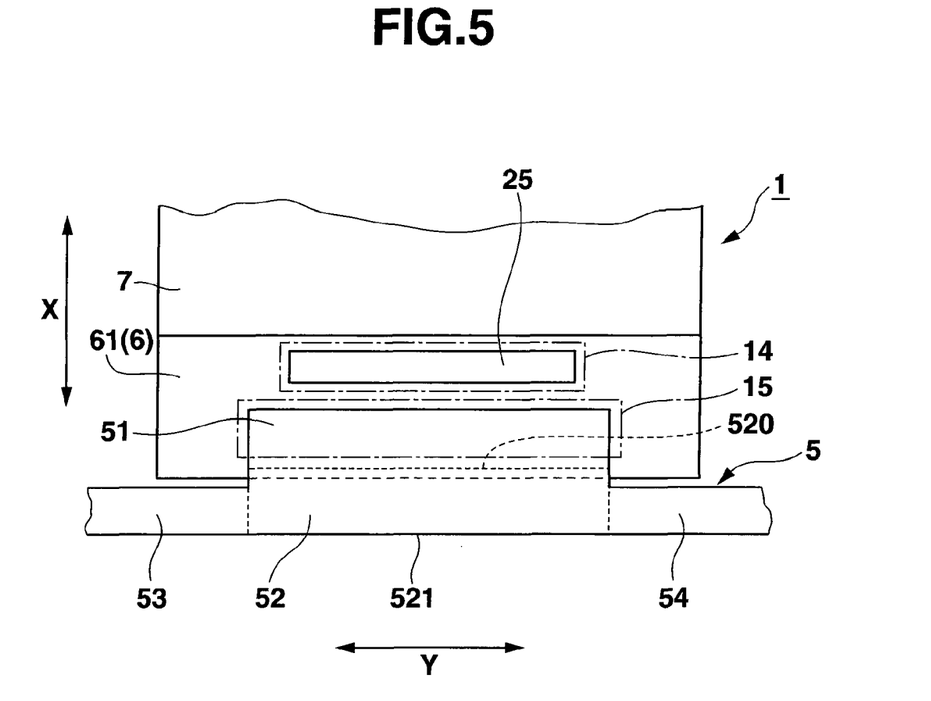
FIG. 5 is a front view schematically showing a joined portion A in FIG. 2.

FIG. 1 is a front perspective view of a display apparatus 100 according to this embodiment, FIG. 2 is a front view of the display apparatus 100, FIG. 3 is a rear view of the display apparatus 100, FIG. 4A is a cross-sectional view of a surface taken through a line IVA-IVA as indicated by arrowheads in FIG. 2 and FIG. 3, FIG. 4B is a cross-sectional view of a surface taken through a line IVB-IVB as indicated by arrowheads in FIG. 2 and FIG. 3, and FIG. 5 is a front view of a joined portion A in FIG. 2. It is to be noted that FIG. 5 is a schematic structural view schematically showing the joined portion A and also illustrating a state before an extended portion 52 of a display wiring substrate 5 is folded back and fixed.

The display apparatus 100 includes a display panel 1, a light source device 2, a housing 3, the display wiring substrate 5, and others.

The housing 3 is a substantially-box-like member that accommodates the display panel 1, the light source device 2, and others therein. The housing 3 includes side plates 32, 33, and 34 provided on a front edge portion of a rectangular bottom plate 31 in a standing condition, so that a front side of the housing 3 is opened, and one of the four side surfaces is opened. As a result, an observation side (a front surface side) of the display panel 1 can be exposed, and the display wiring substrate 5 and a light source wiring substrate 16 joined along one side of the display panel 1 having a substantially rectangular shape can be exposed.

The display panel 1 is a liquid crystal display panel adopting an active matrix system, and is constituted by arranging a front surface of a rectangular first glass substrate (a transparent substrate) 6 and a back surface of a rectangular second glass substrate (a transparent substrate) 7 to face each other through a liquid crystal layer (not shown). First and second transparent electrodes (not shown) are provided on inner surfaces of the first glass substrate 6 and the second glass substrate 7 facing each other. In the first and second transparent electrodes, a plurality of pixels that change an alignment state of liquid crystal molecules in the liquid crystal layer by application of a voltage to control transmission of light are formed into a matrix shape. Further, a polarizing plate 23 is attached to a front surface of the second glass substrate 7 on the observation side. On the other hand, a polarizing plate 24 is attached to a back surface of the first glass substrate 6 on the back surface side. Furthermore, a protruding portion 61 that protrudes from the second glass substrate 7 on the observation side is formed to she first glass substrate 6 on the back surface side. In a display drive circuit joining region 14 of the protruding portion 61 provided alone one side of the first glass substrate 6, a display drive circuit 25 configured to apply a drive voltage to a part between the transparent electrodes is mounted in a state that a terminal of the display drive circuit 25 is electrically connected to a wiring line formed in the display drive circuit joining region 14. Here, a direction orthogonal to one side of the first glass substrate 6 to which the display drive circuit 25 is joined is determined as a first direction X, and a direction parallel to this one side is determined as a second direction Y. The display drive circuit 25 is arranged along one margin on the protruding portion 61 side in margins of the second glass substrate 7 parallel to the second direction Y. This one margin is orthogonal to the first direction X.

Additionally, the display wiring substrate 5 is disposed to the protruding portion 61. The display wiring substrate 5 is a flexible substrate on which a display wiring line through which a control signal from an external drive circuit is output to the display drive circuit 25 is formed. The display wiring substrate 5 has a proximal end portion 51, an extended portion 52, a first fixed portion 53, and a second fixed portion 54. The proximal end portion 51, which is formed into a rectangular tabular shape, is at least partially joined to a wiring substrate joining region 15 of the protruding portion 61, so that the display wiring substrate 5 is joined to the display panel 1. It is to be noted that the wiring substrate joining region 15 is sandwiched between the display drive circuit joining region 14 in which the display drive circuit 25 is provided and the one margin in the display panel 1.

The extended portion 52 is formed into a rectangular tabular shape extended from the proximal end portion 51 in parallel to the first direction X, and it is arranged to be folded back to the front surface side along the first direction X. One edge portion 520 in peripheral edge portions of the extended portion 52 forms a border with respect to the proximal end portion 51 (see FIG. 5). Further, in the peripheral edge portions of the extended portion 52, the other edge portion 521 arranged to face the one edge portion 520 at a position apart from the proximal end portion 51 is arranged to face the front surface side of the proximal end portion 51. Furthermore, the extended portion 52 overlaps at least a part of the display drive circuit 25 or the display drive circuit joining region 14. In this case, the extended portion 52 may overlap part or all of the display drive circuit 25 or the display drive circuit joining region 14. It is to be noted that the other edge portion 521 is a predetermined portion in the peripheral edge portions of the display wiring substrate 5 in this embodiment.

The first fixed portion 53 is provided to extend in parallel to the second direction Y from one margin 523 of a pair of margins of the extended portion 52 parallel to the first direction X.

The first fixed portion 53 is arranged to be folded back to straddle the margin and the side surface (the side plate 32 side) of the display panel 1 along the second direction Y, and an end portion 531 of the first fixed portion 53 is arranged on the back surface side of the display apparatus 100. Here, the end portion 531 of the first fixed portion 53 means an end portion of the first fixed portion 53 on the side opposite to the side connected with the extended portion 52. As shown in FIG. 3, the end portion 531 is arranged along a back surface of the bottom plate 31 of the housing 3 and fixed by a double-sided tape (a fixing member) 13 (see FIG. 4A and FIG. 4B). On a surface of the end portion 531 on the side opposite to a surface facing the bottom plate 31, an interface (a connecting member) 532, a connected portion 533, a plurality of circuit components 534, and others are provided. The interface (a connecting member) 532 will be connected to the external drive circuit to supply a signal to the display wiring substrate 5.

The second fixed portion 54 is provided to extend in the second direction Y from the other margin of the pair of margins of the extended portion 52 parallel to the first direction X. A direction along which the second fixed portion 54 is extended and led out is opposite to a direction along which the first fixed portion 53 is extended and led out.

As shown in FIG. 1, the second fixed portion 54 is arranged to be folded back to straddle the margin and the side surface (the side plate 34 side) of the display panel 1 along the second direction Y, and an end portion 541 of the second fixed portion 54 is arranged on the back surface side of the display apparatus 100. As shown in FIG. 3, the end portion 541 is arranged along the back surface of the bottom plate 31 of the housing 3 and fixed by the double-side tape 13. On a surface of the end portion 541 opposite to a surface of the same facing the bottom plate 31, a plurality of circuit components 542 and others are provided. On the back surface side of the display apparatus 100, the end portion 541 of the second fixed portion 54 and the end portion 531 of the first fixed portion 53 are arranged to prevent themselves from overlapping each other.

In this manner, the first fixed portion 53 and the second fixed portion 54 are extended in a direction orthogonal to a pair of margins adjacent to one margin on the protruding portion 61 side in the plurality of margins of the display panel 1, respectively, and they are folded back to straddle the pair of margins.

The light source device 2 irradiates the display panel 1 with light, and it is arranged on the back side of the display panel 1, i.e., the side opposite to the observation side of the display panel 1 (see FIG. 4A and FIG. 4B). The light source device 2 is configured to include a light guide plate 4 facing the display panel 1, a light source 17 that supplies light to the light guide plate 4, and a light source wiring substrate 16 on which a light source wiring line through which a signal for driving the light source 7 is output to the light source 17 is formed. Besides, the light source device 2 includes a reflection sheet 11, optical sheets 41, 42, and 43, a shielding sheet 12, and others. It is to be noted that the light source device 2 may include a frame that supports the optical sheets 41, 42, and 43 and the shielding sheet 12.

The light guide plate 4 is formed of a transparent member into a rectangular tabular shape. A light exit surface 44 is formed on a front surface of the light guide plate 4, and the light exit surface 44 faces the display panel 1. A light incidence surface 47 through which light from the light source 17 enters is formed on one of side surfaces of the light guide plate 4.

The light source wiring substrate 16 is disposed to one side portion having the light incidence surface 47 formed thereto in the front surface of the light guide plate 4 through a double-sided tape 18. The light source wiring substrate 16 has a light source arranging portion 161 and an extended portion 162. The light source 17 is disposed to the light, source arranging portion 161. The extended portion 162 is provided to be continuous with the light source arranging portion 162, and it is extended to the outside of the display apparatus 100 from an opened side surface in four side surfaces of the housing 3. Furthermore, the extended portion 162 is folded back to the back surface side along the first direction X, and it is arranged to straddle the light guide plate 4, the display wiring substrate 5, and others. A connecting portion (one end portion) 163 is provided at an end of the extended portion 162, and a connection terminal formed at the connecting portion 163 is electrically connected to a connection terminal formed to the connected portion 533 provided to the first fixed portion 53.

The light source 17 shown in FIG. 4A and FIG. 4B is a member that supplies light to the light guide plate 4. The light source 17 is arranged to face the light incidence surface 47 of the light guide plate 4, and a light exit surface 171 is formed on a surface of the light source 17 facing the light incidence surface 47. Light emitted from the light source 17 enters the light guide plate 4 from the light incidence surface 47, and it exits from the light exit surface 44 toward the front surface side of the light guide plate 4.

The reflection sheet 11 is arranged to face the back surface side of the light guide plate 4 and configured to reflect light exiting from the back surface of the light guide plate 4 toward the inside of the light guide plate 4.

The optical sheets 41, 42, and 43 are formed into a substantially rectangular shape and laminated on the light exit surface 44 of the light guide plate 4. Here, the optical sheet 41 immediately above the light exit surface 444 is a light scattering sheet that scatters light exiting from the light exit surface 44 to uniform luminance. Furthermore, each of the optical sheets 42 and 43 is a prism sheet having a configuration that one surface is formed into a flat surface and many fine linear prisms are formed on the other surface. The optical sheets 42 and 43 are arranged so that the flat surfaces face the light guide plate 4 side and the linear prisms are arranged along different directions orthogonal to each other.

The light shielding sheet 12 is formed into a substantially-frame-like shape as seen from the front side, and it surrounds a peripheral portion of a front surface of the optical sheet 43 to prevent light from leaking from the periphery of the optical sheet 43. The light shielding sheet 12 is fixed to the polarizing plate 24 of display panel 1 and the optical sheet 43 by the double-sided tape, and a part of the light shielding sheet 12 is fixed to the housing 3 by the double-sided tape.

Figure 6:
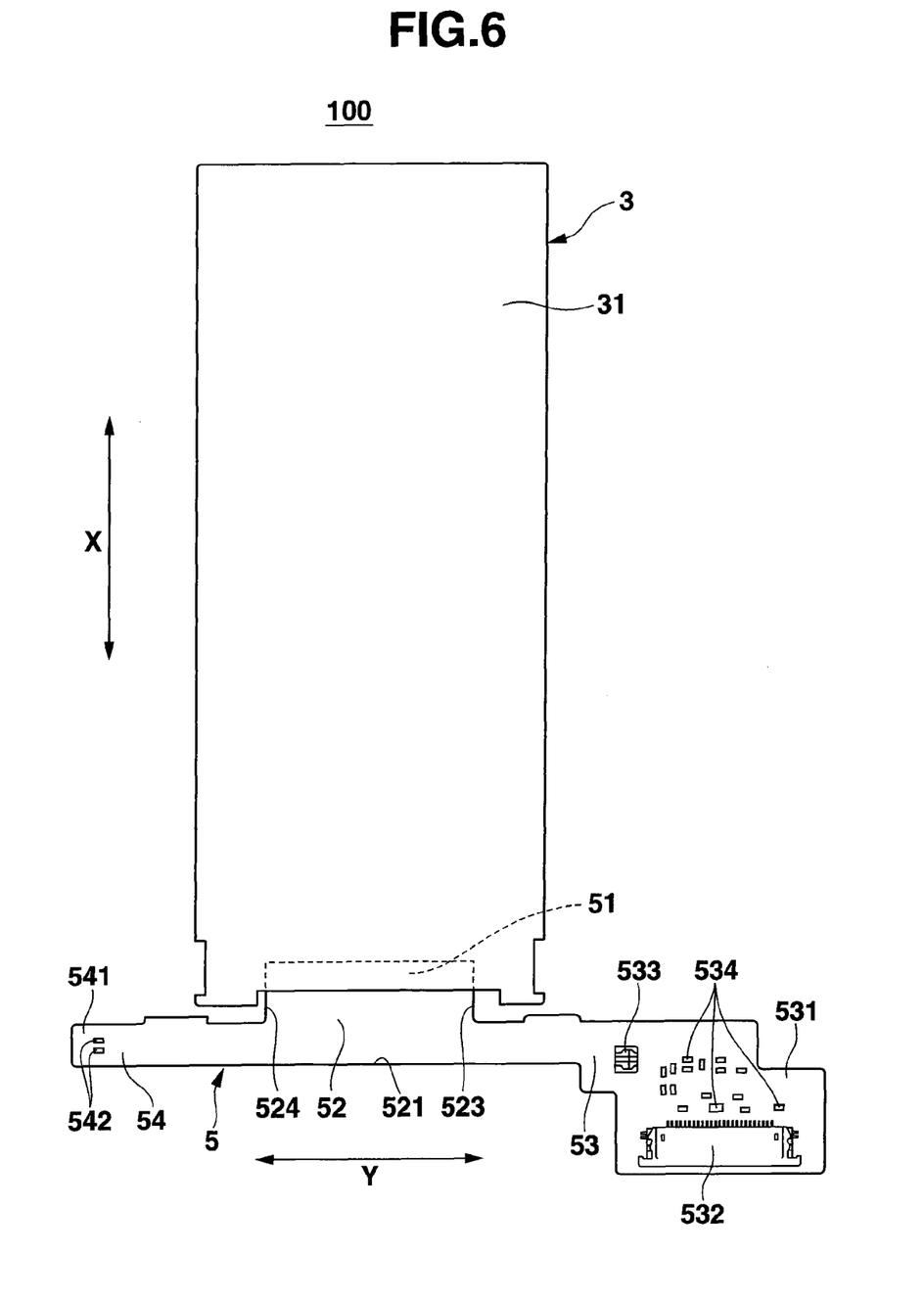
FIG. 6 is a rear view showing the display apparatus before fixing a wiring substrate.
Figure 7:
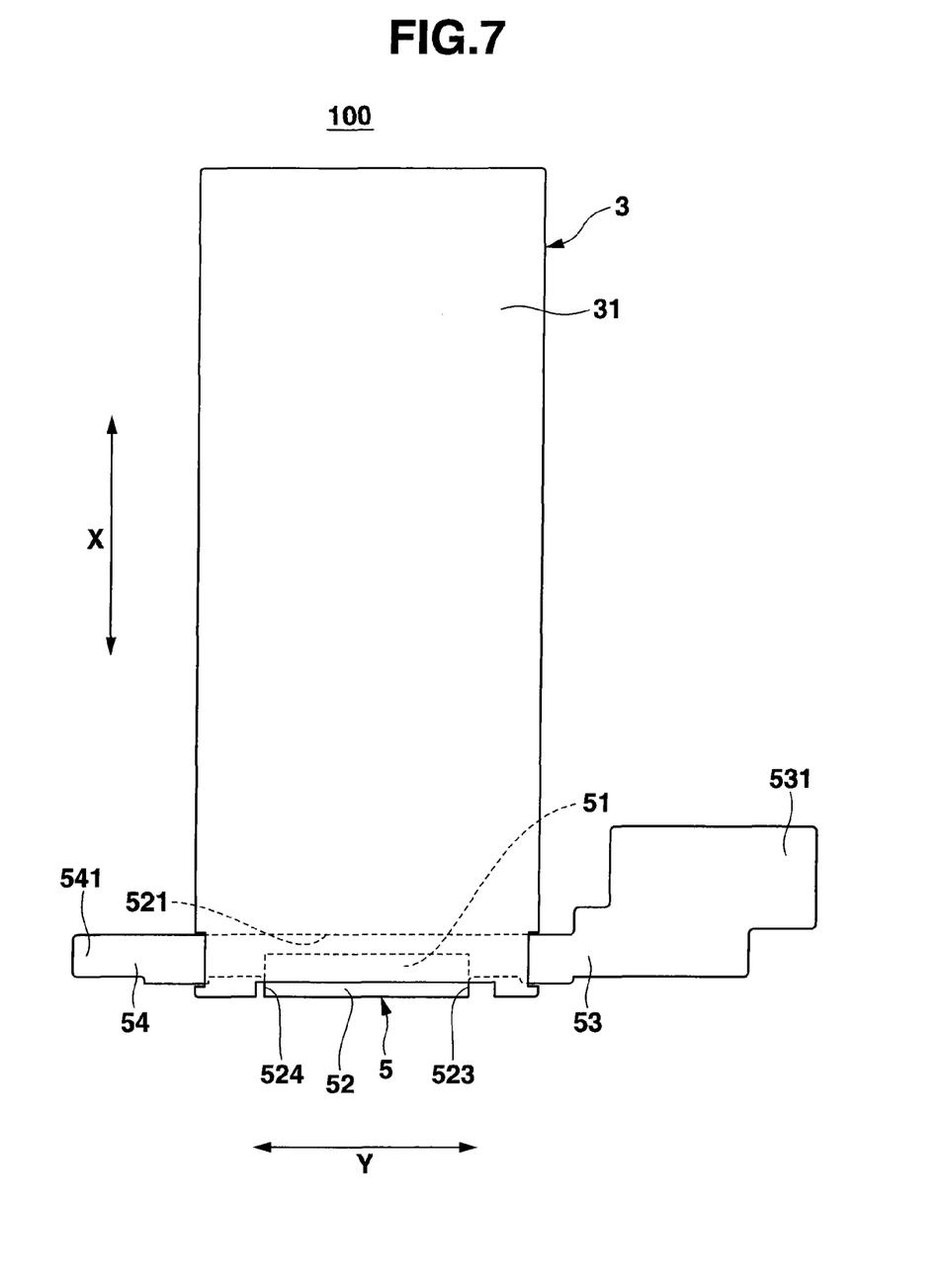
FIG. 7 is a rear view showing the display apparatus with the wiring substrate being partially folded back before fixing the wiring substrate.

A method of fixing the wiring substrate in this embodiment will now be described with reference to FIGS. 1, 2, 3, 4A, 4B, 5, 6, and 7. FIG. 6 is a rear view showing display apparatus 100 before fixing the display wiring substrate 5, and FIG. 7 is a rear view of the display apparatus 100 in a state that the extended portion 52 is folded back before fixing the display wiring substrate 5. It is to be noted that the light source wiring substrate 16 is omitted in FIG. 6 and FIG. 7.

As shown in FIG. 6, in the display apparatus 100 before fixing the display wiring substrate 5, since one of the side surfaces of the housing 3 is opened, the display wiring substrate 5 is led out along the first direction X. The extended portion 52 is arranged to be substantially parallel to the first glass substrate 6 and the second glass substrate 7, and the other edge portion 521 of the extended portion 52 is arranged at a position farther away from the display apparatus 100 in the first direction X than the one edge portion 520 of the same. The first fixed portion 53 and the second fixed portion 54 are extended from the other edge portion 521 in directions opposite to each other.

To fix the display wiring substrate 5, as shown in FIG. 7, the extended portion 52 is first folded back toward the front surface side along the first direction X. As a result, a part of the extended portion 52 overlaps the front surface side of the proximal end portion 51, and the other edge portion 521 of the extended portion 52 is arranged on the front surface side of the protruding portion 61 along the margin of the second glass substrate 7. At this time, the other edge portion 521 of the extended portion 52 overlaps the display drive circuit 25. Therefore, the first fixed portion 53 and the second fixed portion 54 are partially arranged on the front surface side of the protruding portion 61. Therefore, the front surface side of the protruding portion 61 is covered with the extended portion 52, the first fixed portion 53, and the second fixed portion 54. Here, since the extended portion 52 is folded back, reaction force by which the other edge portion 521 of the extended portion 52 is lifted up in a direction away from the protruding portion 61 is produced in the display wiring substrate 5.

Subsequently, the first fixed portion 53 and the second fixed portion 54 are folded back toward the back surface side along the second direction Y while keeping the extended portion 52 in the folded state (see FIGS. 2 and 3). That is, the first fixed portion 53 is folded back toward the back surface side to straddle the side surface (the side plate 32 side) of the display panel 1, and the end portion 531 of the first fixed portion 53 is arranged on the back surface side of the display panel 1. Further, as shown in FIG. 3, the end portion 531 is arranged along the back surface of the bottom plate 31 of the housing 3 and fixed to the bottom plate 31 by the double-side tape 13 (see FIG. 4A and FIG. 4B). As a result, the first fixed portion 53 is fixed to the display apparatus 100, and the margin 523 of the extended portion 52 is fixed.

Likewise, the second fixed portion 54 is folded back toward the back surface side to straddle the side surface (the side plate 34 side) of the display panel 1 along the second direction Y, and the end portion 541 of the second fixed portion 54 is arranged on the back surface side of the display panel 1. The end portion 541 is arranged along the back surface of the bottom plate 31 of the housing 3 and fixed to the bottom plate 31 by the double-sided tape 13. As a result, the second fixed plate 54 is fixed to the display apparatus 100, and the margin 524 of the extended portion 52 is fixed. Therefore, the margins 523 and 524 on both sides of the extended portion 52 parallel to the first direction X are fixed by the first fixed portion 53 and the second fixed portion 54, thereby suppressing the uplift of the extended portion 52.

As described above, according to this embodiment, since the first fixed portion 53 and the second fixed portion 54 are folded back toward the back surface side to be orthogonal to the folding-back direction of the extended portion 52 in the display wiring substrate 5 and these portions are fixed to the back surface of the display apparatus 100, the uplift of the display wiring substrate 5 due to the reaction force can be avoided. Therefore, in the portion joined to the display panel 1, the display wiring substrate 5 is hardly delaminated and can be assuredly fixed.

Furthermore, since the extended portion 52 overlaps at least a part of the display drive circuit 25 or the display drive circuit joining region 14, wiring lines formed on the display drive circuit 25 or the display drive circuit joining region 14 can be protected by the display wiring substrate 5.

Figure 8:
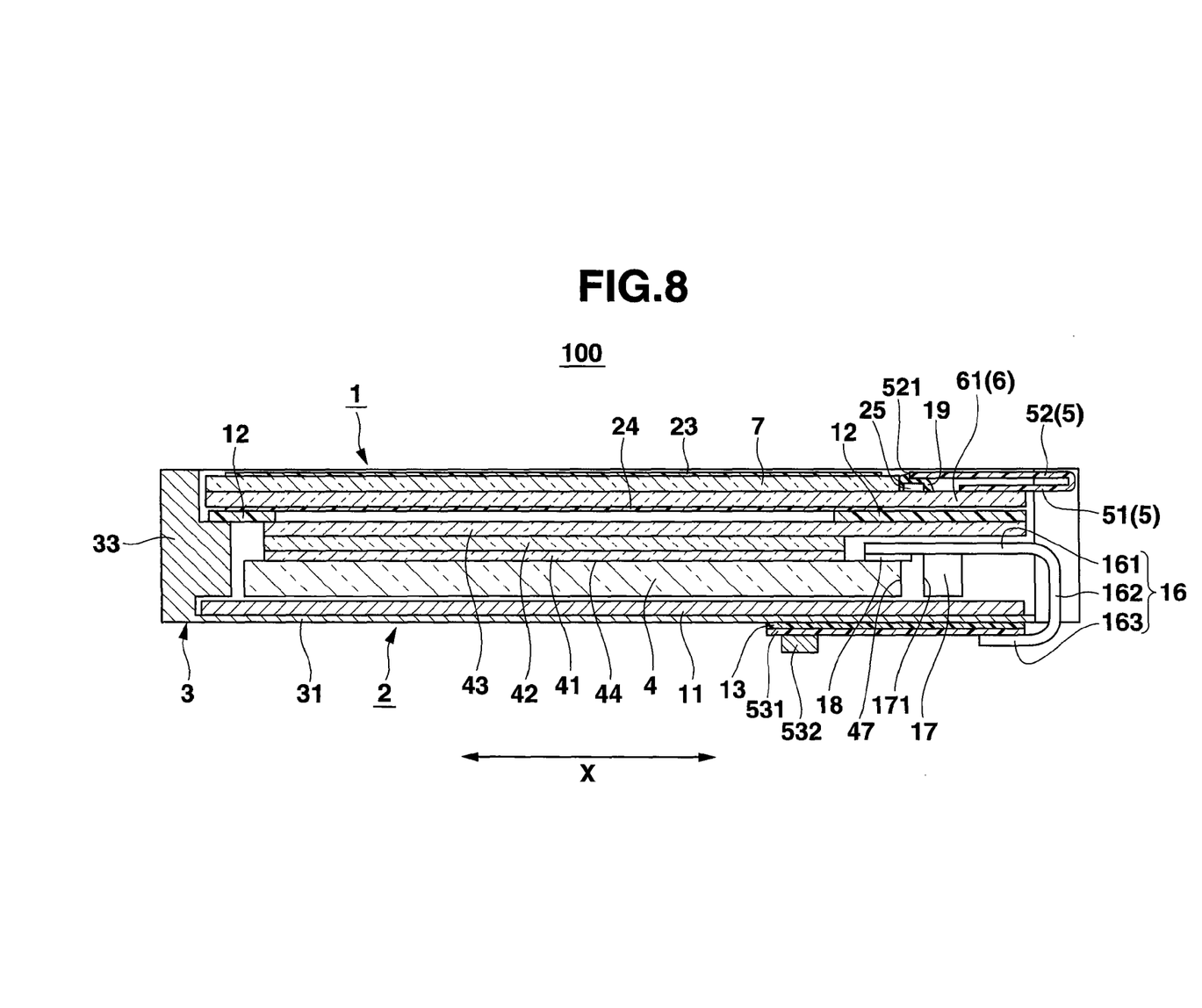
FIG. 8 is a cross-sectional view showing a modification of the display apparatus.

Moreover, the extended portion 52 may be in contact with at least a part of the display drive circuit 25, and at least a part of the display drive circuit 25 and the extended portion 52 may be joined to each other through various kinds of fixing members such as a double-sided tape, a gel-like adhesive compound, or an adhesive agent containing a hardening resin. When the display drive circuit 25 and the extended portion 52 are brought into contact with each other, the display drive circuit 25 can be assuredly protected by the display wiring substrate 5. When the display drive circuit 25 and the extended portion 52 are joined to each other through the fixing member, the drive circuit 25 can be more assuredly protected by the display wiring substrate 5. Additionally, as shown in FIG. 8, this fixing member 19 may cover the periphery of the display drive circuit 25. As a result, the display drive circuit 25 can be more assuredly protected by the display wiring substrate 5 and the fixing member 19. Further, when the other edge portion 521 of the extended portion 52 overlaps the display drive circuit 25, wiring lines formed on the display drive circuit 25 or the display drive circuit joining region 14 can be protected by the display wiring substrate 5.

It is to be noted that, when the above-described effects can be obtained, the direction along which the extended portion 52 is extended does not have to be necessarily parallel to the first direction X, and the directions along which the first fixed portion 53 and the second fixed portion 54 are extended do not have to be necessarily parallel to the second direction Y.

Moreover, when folding back the extended portion 52 toward the front surface side of the display panel 1 along the first direction X, this folding-back direction does not have to be necessarily parallel to the direction along which the extended portion 52 is extended. That is, the direction along which the extended portion 52 is folded back does not have to be necessarily parallel to the first direction. X, and it may deviate from the first direction X when the above-described effects can be obtained. Likewise, when folding back the extended first fixed portion 53 and the second fixed portion 54 along the second direction Y to straddle the side surfaces of the display panel 1, this folding-back direction does not have to be necessarily parallel to the directions along which the first fixed portion 53 and the second fixed portion 54 are extended, respectively. That is, the direction along which the first fixed portion 53 and the second fixed portion 54 are folded back does not have to be necessarily parallel to the second direction Y, and it may deviate from the second direction Y when the above-described effects are obtained.

Additionally, the direction along which the first fixed direction 53 is extended and the direction along which the second fixed direction 54 are extended do not have to be necessarily parallel to each other. That is, the direction along which the first fixed portion 53 is extended and led out and the direction along which the second fixed portion 54 is extended and led out do not have to be precisely opposite to each other. When the above-described effects can be obtained, the first fixed portion 53 may be extended and led out from the extended portion 52 in one direction inclined from the first direction X, and the second fixed portion 54 may be extended and led out from the extended portion 52 in the other direction that is inclined from the first direction X and different from the one direction. In this case, when the one direction and the other direction are line-symmetric in relation to the first direction X, the display panel 1 and the display wiring substrate 5 can be more stably fixed.

Further, when the above-described effects can be obtained, the direction along which the first fixed portion 53 is folded back and the one direction along which the first fixed portion 53 is extended and led out do not have to be necessarily parallel to each other, and the direction along which the second fixed portion 54 is folded back and the other direction along which the second fixed portion 54 is extended and led out do not have to be necessarily parallel to each other.

It is to be noted that the display panel 1 may be, e.g., a plasma display panel, an organic electroluminescence display panel, or a field emission display panel, and it is not restricted to the liquid crystal display panel. In such a case, the display apparatus 100 does not include the light source device 2.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A display apparatus comprising:
   a display panel;
   a drive circuit provided to the display panel; and
   a wiring substrate having a wiring line through which a signal is output to the drive circuit,
   wherein the wiring substrate includes:
      a proximal end portion joined to a predetermined region of the display panel;
      an extended portion that is extended from the proximal end portion and on which the wiring line is routed;
      a first fixed portion extended from the extended portion in a first direction inclined from an extending direction of the extended portion; and
      a second fixed portion extended from the extended portion in a second direction that is inclined from the extending direction of the extended portion and different from the first direction,
   wherein the extended portion is folded back to face a surface of the proximal end portion on an opposite side of a surface of the proximal end portion joined to the display panel, and the first fixed portion and the second fixed portion are folded back so as to straddle side surfaces of the display panel and so that their end portions are arranged on a side of the display panel opposite to a side of the display panel on which the proximal end portion is arranged.

2. The apparatus according to claim 1, wherein the extended portion is folded back along the extending direction of the extended portion.

3. The apparatus according to claim 1, wherein the first fixed portion and the second fixed portion are folded back along a direction orthogonal to the extending direction of the extended portion.

4. The apparatus according to claim 1, wherein the first direction and the second direction are opposite to each other.

5. The apparatus according to claim 1, wherein the drive circuit is provided along one margin among a plurality of margins of the display panel, and the extending direction of the extended portion is orthogonal to the one margin.

6. The apparatus according to claim 1, wherein the drive circuit is provided along one margin among a plurality of margins of the display panel, the first fixed portion is folded back to straddle any one margin of a pair of margins adjacent to the one margin along which the drive circuit is provided, and the second fixed portion is folded back to straddle the other margin of the pair of margins of the display panel.

7. The apparatus according to claim 6, wherein the first direction and the second direction are orthogonal to the pair of margins.

8. The apparatus according to claim 1, wherein the extended portion overlaps at least a part of a drive circuit joining region on which the drive circuit is provided in the display panel.

9. The apparatus according to claim 1, wherein, among peripheral edge portions of the extended portion, one of the peripheral edge portions, which is arranged to face another of the peripheral edge portions that is adjacent to the proximal end portion, overlaps the drive circuit.

10. The apparatus according to claim 1, wherein the extended portion is in contact with at least a part of the drive circuit.

11. The apparatus according claim 1, wherein the extended portion is joined to at least a part of the drive circuit.

12. The apparatus according claim 11, wherein a periphery of the drive circuit is covered with a fixing member that joins the part of the drive circuit to the extended portion.

13. The apparatus according to claim 1, wherein the drive circuit is provided along one margin among a plurality of margins of the display panel, and the proximal end portion of the wiring substrate is joined to a region sandwiched between a drive circuit joining region in the display panel in which the drive circuit is provided and the one margin among the plurality of margins of the display panel along which the drive circuit is provided.

14. The apparatus according to claim 1, further comprising a light source device configured to irradiate the display panel with light,
wherein the light source device comprises:
   a light guide plate arranged to face the display panel;
   a light source arranged to face a light incidence surface of the light guide plate; and
   a light source wiring substrate having a light source wiring line through which a signal for driving the light source is output to the light source, and
wherein the display panel comprises a liquid crystal display panel in which a pair of transparent substrates are arranged to face each other through a liquid crystal layer.

15. The apparatus according to claim 14, further comprising a housing configured to accommodate the light source device therein,
wherein the housing comprises:
   a bottom plate configured to cover a side of the light source device opposite to a side of the light source device on which the display panel is arranged; and
   a plurality of side plates provided in a standing condition from the bottom plate and configured to cover a lateral side of the light source device, and
wherein an end portion of the first fixed portion and an end portion of the second fixed portion are fixed to a surface of the bottom plate on an opposite side of a surface of the bottom plate that covers the light source device.

16. The apparatus according to claim 15, wherein the end portion of the first fixed portion and the end portion of the second fixed portion are fixed to the bottom plate by a fixing member.

17. The apparatus according to claim 14, wherein one end portion of the light source wiring substrate is joined to the end portion of the first fixed portion.

18. The apparatus according to claim 1, wherein the first fixed portion is provided with a connecting member, and the connecting member is connected to an external drive circuit configured to supply a signal to the wiring substrate.

\* \* \* \* \*

UNITED STATES PATENT AND TRADEMARK OFFICE
CERTIFICATE OF CORRECTION

| | |
|---|---|
| PATENT NO. | : 8,537,323 B2 |
| APPLICATION NO. | : 13/044879 |
| DATED | : September 17, 2013 |
| INVENTOR(S) | : Jun Hiranobu |

Page 1 of 1

It is certified that error appears in the above-identified patent and that said Letters Patent is hereby corrected as shown below:

In the Claims

In Column 9, Line 22: (Claim 11, Line 1):

delete "according claim" and insert --according to claim--.

In Column 9, Line 24: (Claim 12, Line 1):

delete "according claim" and insert --according to claim--.

In Column 10, Line 5: (Claim 14, line 5):

delete "haying" and insert --having--.

Signed and Sealed this
Twenty-fifth Day of February, 2014

Michelle K. Lee
*Deputy Director of the United States Patent and Trademark Office*